(12) United States Patent
Kim et al.

(10) Patent No.: US 10,707,023 B2
(45) Date of Patent: Jul. 7, 2020

(54) ELECTRONIC COMPONENTS

(71) Applicant: SAMSUNG ELECTRO-MECHANICS CO., LTD., Suwon-si, Gyeonggi-do (KR)

(72) Inventors: Ho Yoon Kim, Suwon-si (KR); Jae Yeol Choi, Suwon-si (KR); Soo Hwan Son, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/526,082

(22) Filed: Jul. 30, 2019

(65) Prior Publication Data
US 2019/0355525 A1  Nov. 21, 2019

Related U.S. Application Data

(63) Continuation of application No. 16/155,474, filed on Oct. 9, 2018.

(30) Foreign Application Priority Data

Feb. 22, 2018  (KR) .......................... 10-2018-0021088

(51) Int. Cl.
*H01G 4/232* (2006.01)
*H01G 4/30* (2006.01)
(Continued)

(52) U.S. Cl.
CPC .............. *H01G 4/38* (2013.01); *H01G 4/2325* (2013.01); *H01G 4/30* (2013.01); *H05K 1/112* (2013.01);
(Continued)

(58) Field of Classification Search
CPC .......... H01G 2/06; H01G 4/2325; H01G 4/30; H01G 4/38; H01G 4/232; H01G 4/248;
(Continued)

(56) References Cited

U.S. PATENT DOCUMENTS

| 4,814,857 A * | 3/1989 | Werbizky ............. H05K 7/1053 174/260 |
| 2008/0079136 A1 * | 4/2008 | Li ........................ H05K 1/0212 257/691 |

(Continued)

FOREIGN PATENT DOCUMENTS

| JP | 2012-043947 A | 3/2012 |
| KR | 10-2008-0060624 A | 7/2008 |

(Continued)

OTHER PUBLICATIONS

Non-Final Office Action issued in U.S. Appl. No. 16/155,474 dated May 1, 2019.

*Primary Examiner* — Timothy J Thompson
*Assistant Examiner* — Guillermo J Egoavil
(74) *Attorney, Agent, or Firm* — Morgan, Lewis & Bockius LLP (57) ABSTRACT

An electronic component includes: a plurality of multilayer capacitors stacked in multiple rows and columns and each having external electrodes on both ends thereof in a first direction; and a board including a body and a connection portion. The connection portion includes: a plurality of positive electrode land patterns; a plurality of negative electrode land patterns; positive and negative electrode terminal patterns formed on a lower surface of the body to be spaced apart from each other in the first direction; a positive electrode connection portion connecting the plurality of positive electrode land patterns to the positive electrode terminal pattern; and a negative electrode connection (Continued)

portion connecting the plurality of negative electrode land patterns to the negative electrode terminal pattern.

16 Claims, 9 Drawing Sheets

(51) Int. Cl.
  *H01G 4/38* (2006.01)
  *H05K 1/11* (2006.01)
  *H05K 1/18* (2006.01)
  *H01G 4/248* (2006.01)
(52) U.S. Cl.
  CPC .............. *H05K 1/181* (2013.01); *H01G 4/248* (2013.01); *H05K 2201/10015* (2013.01); *H05K 2201/10515* (2013.01); *H05K 2201/10522* (2013.01)
(58) Field of Classification Search
  CPC .......... H01G 4/002; H01G 4/224; H01G 4/12; H05K 1/112; H05K 1/11; H05K 1/18; H05K 1/181; H05K 1/0212; H05K 1/0231; H05K 1/0206; H05K 1/145; H05K 1/141; H05K 1/182; H05K 1/111; H05K 2201/10015; H05K 2201/10515; H05K 2201/10522; H05K 2201/09481; H05K 2201/10325; H05K 2201/10734; H05K 2201/049; H05K 2201/10636; H05K 2201/10651; H05K 2201/10674; H05K 2201/09236; H05K 2201/09254; H05K 2201/1053
  USPC .......................... 174/260; 361/782; 257/691
  See application file for complete search history.

(56) References Cited

U.S. PATENT DOCUMENTS

| | | | | |
|---|---|---|---|---|
| 2011/0110060 A1* | 5/2011 | Togashi | ............... | H05K 1/0231 361/782 |
| 2013/0201616 A1* | 8/2013 | Arnold | .................... | G06F 1/183 361/679.02 |
| 2014/0043723 A1 | 2/2014 | Hattori et al. | | |
| 2016/0293335 A1* | 10/2016 | Adachi | .................... | H01G 4/40 |

FOREIGN PATENT DOCUMENTS

| | | | | |
|---|---|---|---|---|
| KR | 20080060624 A | * | 7/2008 | ......... G01R 1/07314 |
| KR | 10-1031111 B1 | | 4/2011 | |
| KR | 10-2014-0020774 A | | 2/2014 | |

* cited by examiner

ELECTRONIC COMPONENTS

CROSS-REFERENCE TO RELATED APPLICATION(S)

This application is the continuation application of U.S. patent application Ser. No. 16/155,474 filed on Oct. 9, 2018, which claims the benefit of priority to Korean Patent Application No. 10-2018-0021088 filed on Feb. 22, 2018 in the Korean Intellectual Property Office, the disclosure of which is incorporated herein by reference in its entirety.

BACKGROUND

1. Field

The present disclosure relates to an electronic component.

2. Description of Related Art

A multilayer capacitor is manufactured by stacking a plurality of thin sheets in which an organic material and an inorganic material are combined, cutting the stacked sheets and calcining and sintering the cut sheet portions.

Therefore, as a size of a product is increased, it may be more difficult to cut the product, and stress applied to the product at the time of cutting may be further increased.

In addition, as the size of the product is increased, there is a difficulty in burn-out and sintering of an organic material in a deep portion within the product in the calcining and sintering.

Therefore, when the product has a size of a predetermined level or more, there is a difficulty in a manufacturing process, and reliability or a defect rate of the product may be deteriorated due to the occurrence of electrostrictive center cracks or warpage cracks of an edge.

Meanwhile, recently, as the number of electronic components for industrial and electric fields has increased, demand for large-sized electronic components requiring high capacity, high voltage, and high reliability has increased.

Therefore, a method of stacking a plurality of multilayer capacitors being manufactured using an easy manufacturing process, securing a predetermined level of reliability of a product, and decreasing a defect rate of the product to a predetermined level or less has been required.

SUMMARY

An aspect of the present disclosure may provide an electronic component in which a plurality of multilayer capacitors are stacked, having an easy manufacturing process, securing high capacitance, securing reliability of a product at a predetermined level, and decreasing a defect rate of the product to a predetermined level or less.

According to an aspect of the present disclosure, an electronic component may include: a plurality of two-cap type multilayer capacitors stacked in multiple rows and columns and each having external electrodes on both ends thereof in a first direction; and a board including a body and a connection portion, wherein the connection portion includes: a plurality of positive electrode land patterns, disposed on an upper surface of the body to be spaced apart from each other in the first direction and on which positive external electrodes of the multilayer capacitors are mounted; a plurality of negative electrode land patterns, disposed on the upper surface of the body to alternate with the positive electrode land patterns in the first direction and on which negative external electrodes of the multilayer capacitors are mounted; positive and negative electrode terminal patterns formed on a lower surface of the body to be spaced apart from each other in the first direction; a positive electrode connection portion connecting the plurality of positive electrode land patterns to the positive electrode terminal pattern; and a negative electrode connection portion connecting the plurality of negative electrode land patterns to the negative electrode terminal pattern.

One of the positive electrode land patterns may be exposed to a first edge of the body in the first direction, one of the negative electrode land patterns may be exposed to a second edge of the body opposing the first edge thereof, the positive electrode terminal pattern may be exposed to a third edge of the body in the first direction, the negative electrode terminal pattern may be exposed to a fourth edge of the body opposing the third edge thereof, one of the positive electrode connection portions may be a positive electrode connection pattern formed on a first surface of the body in the first direction, and one of the negative electrode connection portions may be a negative electrode connection pattern formed on a second surface of the body opposing the first surface thereof in the first direction.

A plurality of grooves may be formed in the first and second surfaces of the body, and the positive and negative electrode connection patterns may be formed in the plurality of grooves, respectively.

The positive electrode connection portion may include at least one positive via electrode formed in the board in a thickness direction and at least one positive electrode conductive layer, and the negative electrode connection portion may include at least one negative via electrode formed in the board in the thickness direction and at least one negative electrode conductive layer.

Adjacent external electrodes of the plurality of multilayer capacitors may be connected to each other to form a single capacitor block, and a plurality of capacitor blocks may be stacked on the board in multiple rows and columns.

In the capacitor block, an adhesive portion may be formed between external electrodes of adjacent multilayer capacitors.

A conductive adhesive layer may be formed between the capacitor block and the board.

The conductive adhesive layer may be a flux or solder.

The positive electrode land pattern may include a first positive electrode land pattern exposed to a first edge of the body in the first direction and a second positive electrode land pattern disposed on the upper surface of the body to be spaced apart from the first positive electrode land pattern in the first direction, the negative electrode land pattern may include a first negative electrode land pattern exposed to a second edge of the body opposing the first edge thereof and a second negative electrode land pattern disposed on the upper surface of the body between the first and second positive electrode land patterns, the positive electrode terminal pattern may include a first body portion exposed to a third edge of the body in the first direction and at least one first extension portion extended from the first body portion to a position corresponding to the second positive electrode land pattern, the negative electrode terminal pattern may include a second body portion exposed to a fourth edge of the body opposing the third edge thereof, and at least one second extension portion extended from the second body portion to a position corresponding to the second negative electrode land pattern, the positive electrode connection portion may include a positive electrode connection pattern formed on a first surface of the body in the first direction and connecting the first positive electrode land pattern and the first body portion to each other, and a first via electrode connecting the second positive electrode land pattern and the first extension portion to each other, the negative electrode connection portion may include a negative electrode connection pattern formed on a second surface of the body opposing the first surface thereof in the first direction and connecting the first negative electrode land pattern and the second body portion to each other, and a second via electrode connecting the second negative electrode land pattern and the second extension portion to each other, and the first external electrodes of the multilayer capacitors may be mounted on the first and second positive electrode land patterns, and the second external electrodes of the multilayer capacitors may be mounted on the first and second negative electrode land patterns.

The electronic component may further include an insulating layer formed to cover upper portions of the plurality of multilayer capacitors.

The multilayer capacitors may include a capacitor body including first and second internal electrodes stacked to be alternately exposed to both surfaces thereof in a length direction, and the first and second internal electrodes may be connected to the first and second external electrodes, respectively.

In the multilayer capacitor, first and second plated layers may be formed on the first and second external electrodes, respectively.

The first and second plated layers may be tin (Sn) plated layers.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Directions of a hexahedron will be defined in order to clearly describe exemplary embodiments in the present disclosure. X, Y and Z illustrated in the accompanying drawings denote a length direction, a width direction, and a thickness direction, respectively. Here, the thickness direction may be the same as a stacking direction in which dielectric layers are stacked in a multilayer capacitor.

Further, for convenience of explanation, surfaces of a body opposing each other in the Z direction will be defined as first and second surfaces, and surfaces of the body opposing each other in the X direction will be defined as third and fourth surfaces.

Multilayer Capacitor

Figure 1:
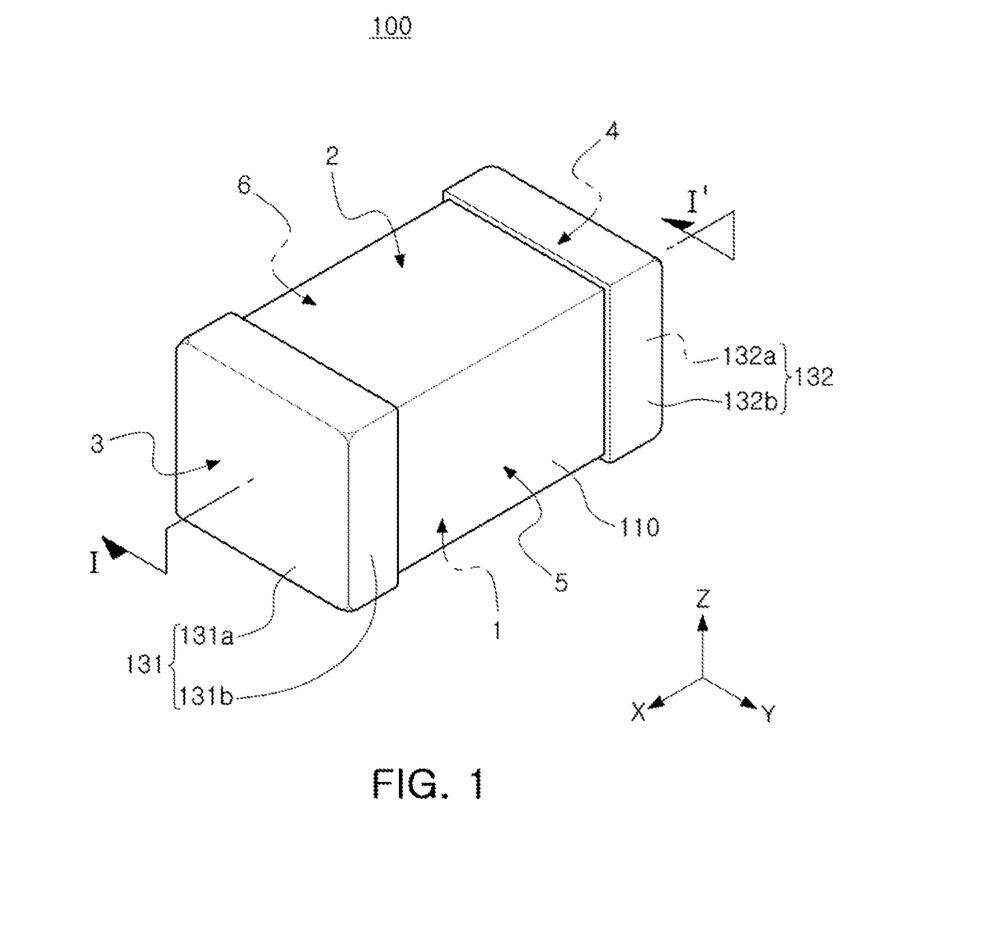
FIG. 1 is a perspective view schematically illustrating a multilayer capacitor applied to an electronic component according to an exemplary embodiment in the present disclosure.
Figure 2:
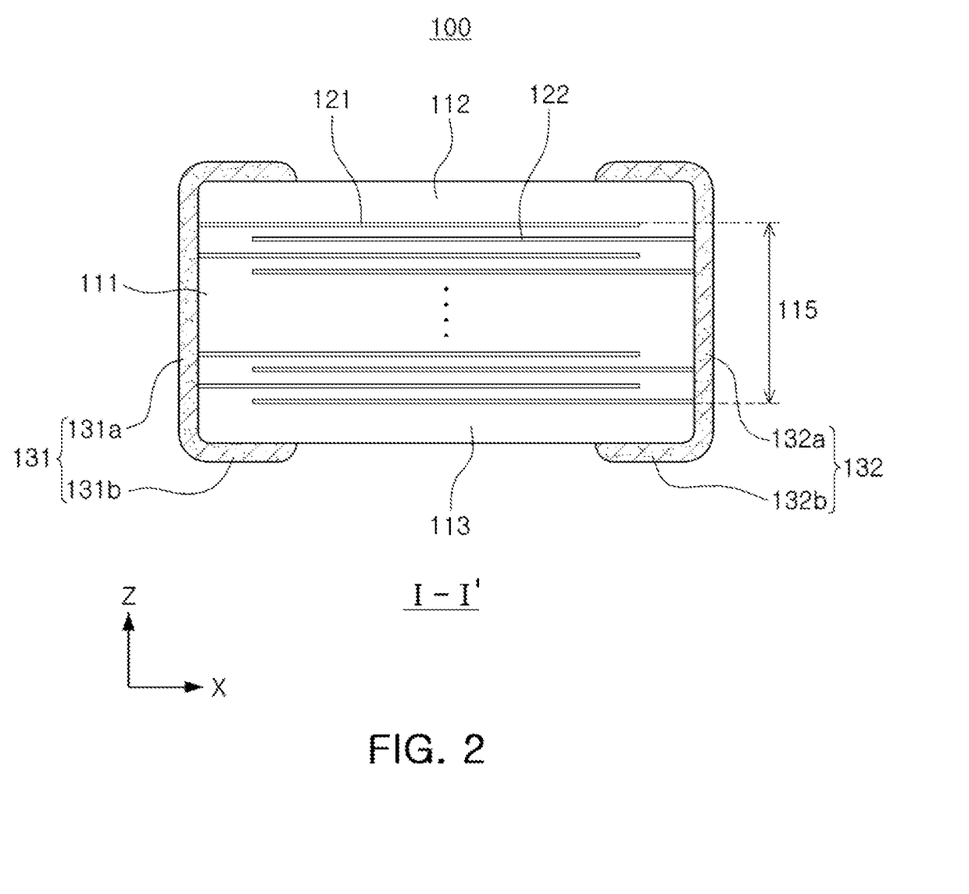
FIG. 2 is a cross-sectional view taken along line I-I' of FIG. 1.
Figure 3:
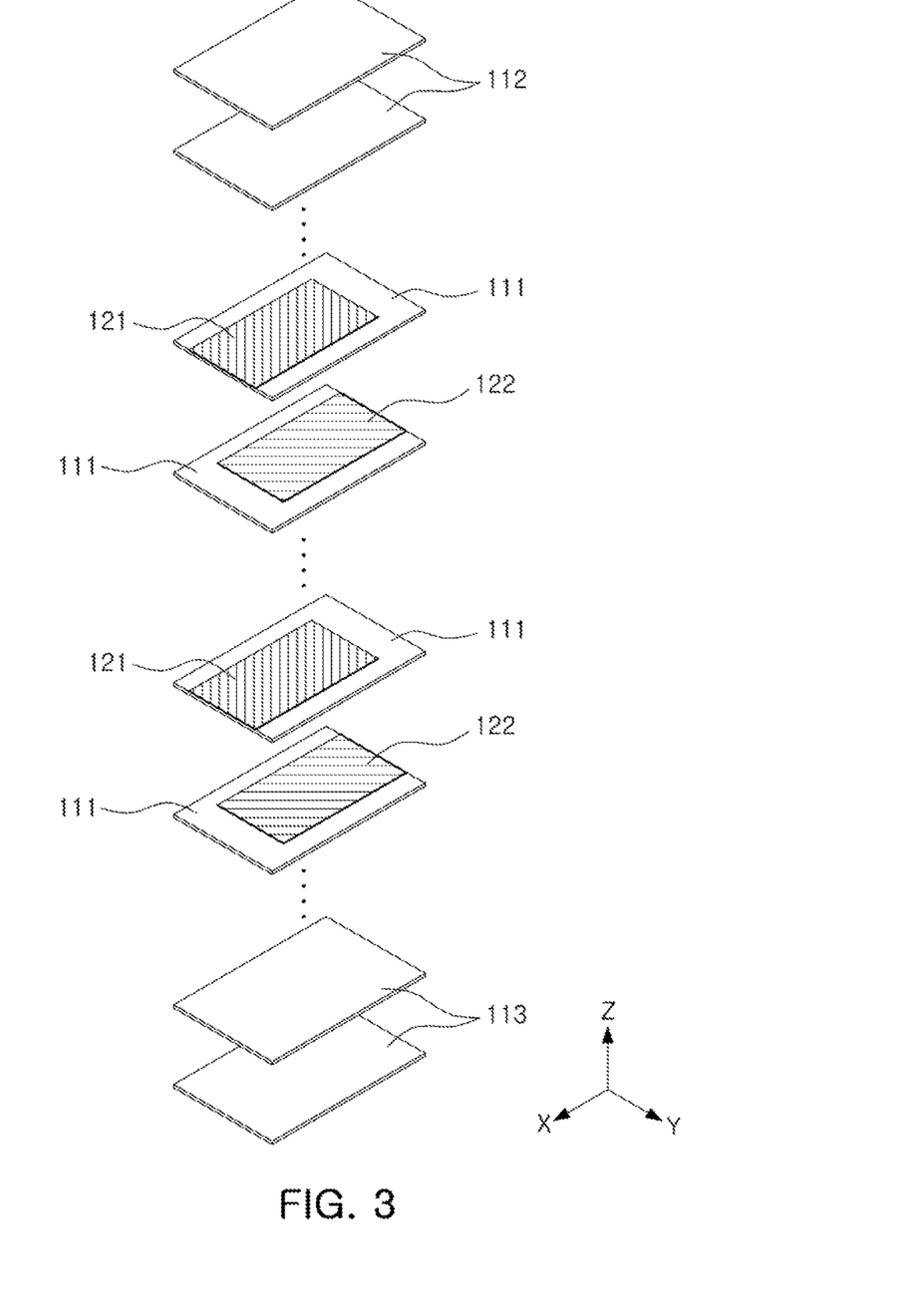
FIG. 3 is an exploded perspective view of a body of FIG. 1.

FIG. 1 is a perspective view schematically illustrating a multilayer capacitor of an electronic component according to an exemplary embodiment in the present disclosure, FIG. 2 is a cross-sectional view taken along line I-I' of FIG. 1, and FIG. 3 is an exploded perspective view of a body of FIG. 1.

Referring to FIGS. 1 through 3, a multilayer capacitor 100 according to the present exemplary embodiment may include a capacitor body 110; and first and second external electrodes 131 and 132.

The capacitor body 110 may be formed by stacking a plurality of dielectric layers 111 in the Z direction and sintering the stacked dielectric layers 111. In this case, a shape and a dimension of the capacitor body 110 and the number of stacked dielectric layers 111 may be variously changed and are not limited to those of the present exemplary embodiment.

In addition, the plurality of dielectric layers 111 configuring the capacitor body 110 may be in a sintered state, and adjacent dielectric layers 111 may be integrated with each other so that boundaries therebetween may not be readily apparent without a scanning electron microscope (SEM).

Further, the capacitor body 110 may include an active region 115 as a portion contributing to forming capacitance of the capacitor and upper and lower covers 112 and 113 formed on upper and lower surfaces of the active region 115 as upper and lower margin portions, respectively.

The active region 115 may be formed by repeatedly stacking a plurality of first and second internal electrodes 121 and 122 with each of the dielectric layers 111 interposed therebetween in the Z direction.

In this case, a thickness of the dielectric layer 111 may be suitably changed according to a capacitance design of the multilayer capacitor 100.

Further, the dielectric layer 111 may contain ceramic powder having high permittivity such as barium titanate ($BaTiO_3$) based powder or strontium titanate ($SrTiO_3$) based powder. However, a material of the dielectric layer 111 is not limited thereto.

The upper and lower covers 112 and 113 may have the same material and configuration as those of the dielectric layer 111 of the active region 115 except that internal electrodes are not included therein.

The upper and lower covers 112 and 113 may be formed by stacking one or two or more dielectric layers on the upper and lower surfaces of the active region 115 in the thickness direction, respectively, and generally serve to prevent the first and second internal electrodes 121 and 122 from being damaged by physical or chemical stress.

The first and second internal electrodes 121 and 122, electrodes having different polarities from each other, may be formed by printing a conductive paste containing a conductive metal on the dielectric layers 111 at a predetermined thickness.

In this case, the conductive metal contained in the conductive paste may be, for example, nickel (Ni), copper (Cu), palladium (Pd), or an alloy thereof. However, the conductive metal is not limited thereto.

Further, as a printing method of the conductive paste, for example, a screen printing method, a gravure printing method, or the like, may be used. However, the printing method is not limited thereto.

The first and second internal electrodes 121 and 122 may be alternately stacked in the capacitor body 110 to face each other in the stacking direction of the dielectric layers 111.

Therefore, the first and second internal electrodes 121 and 122 may be disposed to be alternately exposed to both surfaces of the body 110 in the X direction, with each of the dielectric layers 111 interposed therebetween. In this case, the first and second internal electrodes 121 and 122 may be electrically insulated from each other by the dielectric layer 111 disposed therebetween.

Further, portions of the first and second internal electrodes 121 and 122 alternately exposed to both end surfaces of the body 110 in the X direction may mechanically come in contact with first and second connection portions of the first and second external electrodes 131 and 132 to be described below, respectively, such the first and second internal electrodes 121 and 122 may be electrically connected to the first and second external electrodes 131 and 132, respectively.

Therefore, when voltage is applied to the first and second external electrodes 131 and 132, electric charges are accumulated between the first and second internal electrodes 121 and 122 facing each other. In this case, capacitance of the multilayer capacitor 100 may be in proportion to an area of an overlapping region between the first and second internal electrodes 121 and 122 in the active region 115.

Further, a thickness of the first and second internal electrodes 121 and 122 may be determined according to the use thereof.

The first and second external electrodes 131 and 132 may be formed of a conductive paste containing a conductive metal.

Here, the conductive metal may be, for example, nickel (Ni), copper (Cu), palladium (Pd), gold (Au) or an alloy thereof. However, the conductive metal is not limited thereto.

The first and second external electrodes 131 and 132, as described above, may include first and second connection portions 131a and 132a and first and second band portions 131b and 132b, respectively.

In the first and second external electrodes 131 and 132, the first and second connection portions 131a and 132a may be portions disposed on both surfaces of the body 110 in the X direction, respectively, and the first and second band portions 131b and 132b may be portions extended from the first and second connection portions 131a and 132a to portions of the lower surface, a mounting surface of the body 110, respectively.

Here, the first and second band portions 131b and 132b may be further extended up to at least one surface of an upper surface of the body 110 and both surfaces of the body in the Y direction.

In addition, although a case in which the first and second band portions 131b and 132b of the first and second external electrodes 131 and 132 are all extended from the first and second connection portions 131a and 132a to portions of the upper surface of the body 110 and both surfaces thereof in the Y direction to cover both end portions of the body 110 is described and illustrated in the present exemplary embodiment, the first and second band portions 131b and 132b are not limited thereto.

Electronic Component

Figure 4:
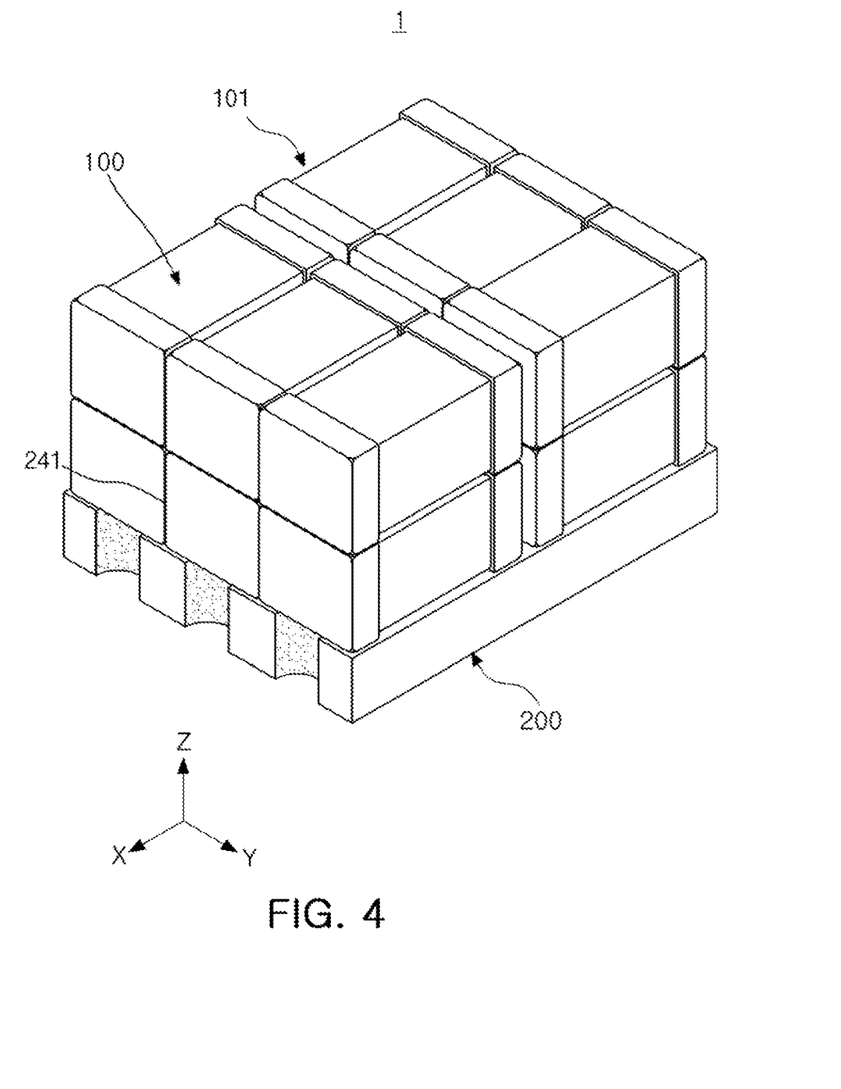
FIG. 4 is a perspective view of the electronic component according to the exemplary embodiment in the present disclosure.
Figure 5:
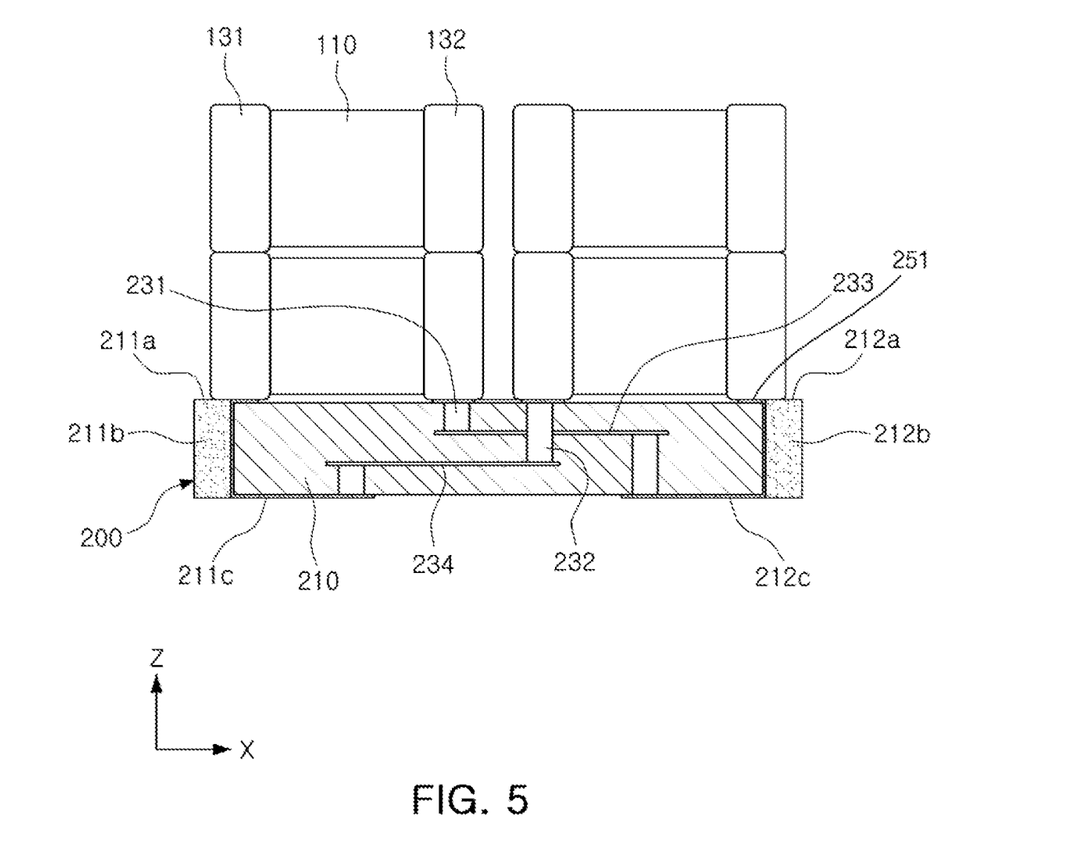
FIG. 5 is a cross-sectional view of the electronic component of FIG. 4 in an X-Z direction.
Figure 6:
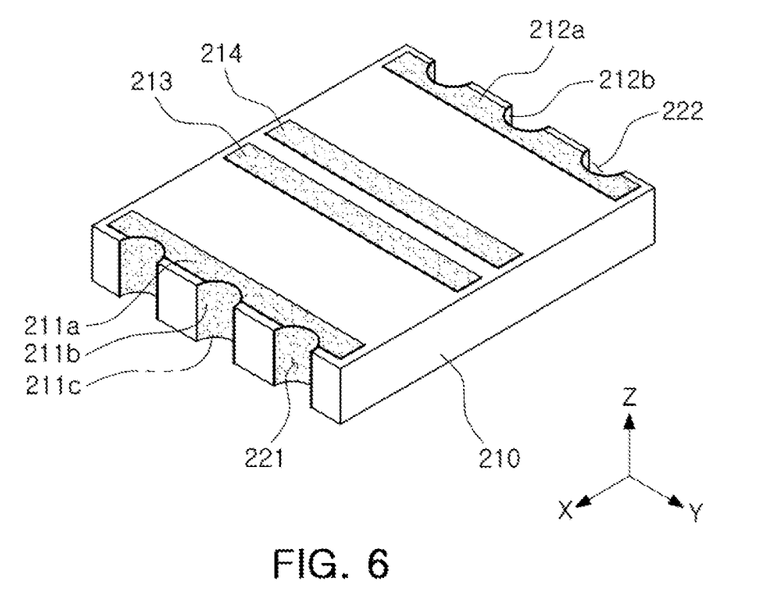
FIG. 6 is a front view of a board of the electronic component of FIG. 4.
Figure 7:
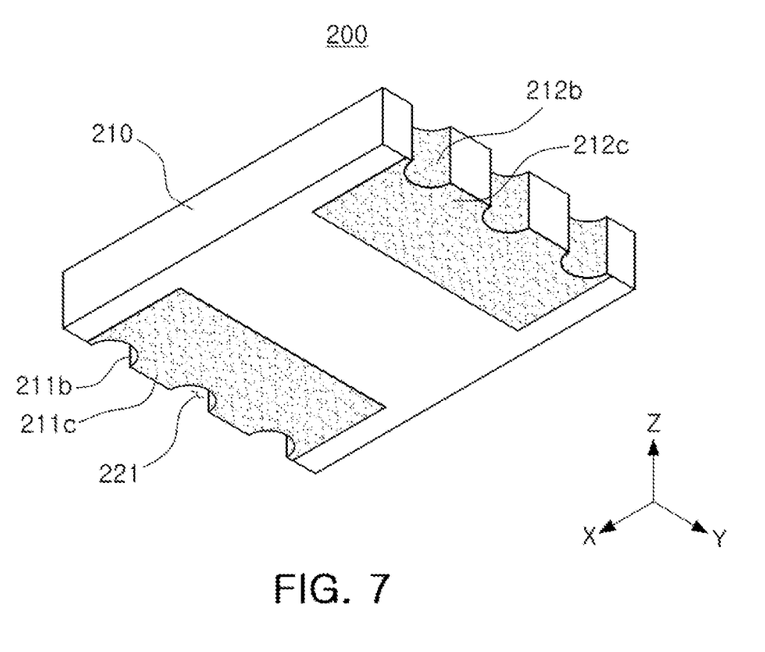
FIG. 7 is a rear view of the board of the electronic component of FIG. 4.

FIG. 4 is a perspective view of the electronic component according to the exemplary embodiment in the present disclosure, FIG. 5 is a cross-sectional view of the electronic component of FIG. 4 in an X-Z direction, FIG. 6 is a front view of a board of the electronic component of FIG. 4, and FIG. 7 is a rear view of the board of the electronic component of FIG. 4.

Referring to FIGS. 4 through 7, an electronic component according to the exemplary embodiment in the present disclosure may include a plurality of 2-cap type multilayer capacitors 100 and a board 200 having an upper surface on which the plurality of multilayer capacitors 100 are stacked in multiple rows and columns and including a body 210 and a connection portion.

The multilayer capacitor 100 may include a body 110 including first and second internal electrodes 121 and 122 stacked to be alternately exposed to both surfaces of the body 110 in the X direction, wherein the first and second internal electrodes 121 and 122 may be electrically connected to first and second external electrodes 131 and 132, respectively.

Further, in the multilayer capacitor 100, first and second plated layers may be formed on the first and second external electrodes 131 and 132, respectively.

Here, the first and second plated layers may be formed of tin (Sn) plated layers.

In the present exemplary embodiment, the plurality of multilayer capacitors 100 may be adjacently arranged in parallel to each other, an adhesive portion 241 formed of a flux, or the like, may be formed between adjacent external electrodes, and the plurality of capacitors 100 may be connected to each other by the adhesive portion 241, thereby forming a single capacitor block 101.

Alternatively, adjacent multilayer capacitors 100 may be bonded to each other directly through the first and second plated layers of the first and second external electrodes 131 and 132. For example, when the tin (Sn) of the plating layer is melted and diffused during a reflow process, adjacent first external electrodes 131, and adjacent second external electrodes 132, may form a bond without the need for solder or other added adhesive. Hence, the adjacent external electrodes may be integrally formed.

Although a case in which three multilayer capacitors 100 may be adhered to each other by the adhesive portion 241 in the Y direction to form a single capacitor block 101 is described in the present exemplary embodiment, the number of capacitor blocks in the present disclosure is not limited to 3.

The electronic component 1 according to the present disclosure may have a structure in which a plurality of capacitor blocks 101 are stacked on the board 200 in multiple rows and columns using surface mounting technology (SMT) equipment.

Although a case in which the electronic component 1 has capacitor blocks 101 disposed with 2×3×2 (X×Y×Z) arrangement is illustrated and described in the present exemplary embodiment, but the electronic component 1 is not limited thereto.

Here, a conductive adhesive layer 251 may be formed between the board 200 and the capacitor block 101.

The conductive adhesive layer 251 may be flux or solder.

In addition, the board 200 on which the capacitor block 101 is stacked may be subjected to a reflow process, such that the capacitor block 101 and the board 200 may be firmly fixed to each other by expansion of the plating layer or melting of solder.

As described above, in a case of configuring the electronic component 1 by stacking a plurality of multilayer capacitors 100 in at least two rows and at least two columns (2 rows×2 columns), in order to connect the multilayer capacitors 100 in parallel, there is a need to design a circuit so that all the multilayer capacitors 100 are connected in parallel to each other on the board 200 in a lower portion of the electronic component 1.

Hereinafter, a connection portion of the board 200 for design the circuit as described above will be described in detail.

The connection portion may include a plurality of positive electrode land patterns 211a and 214, a plurality of negative electrode land patterns 212a and 213, positive and negative electrode terminal patterns 211c and 212c, and positive and negative electrode connection portions, respectively.

Further, the connection portion may be formed by a conductive paste.

Here, the conductive metal may be, for example, nickel (Ni), copper (Cu), palladium (Pd), gold (Au) or an alloy thereof. However, the conductive metal is not limited thereto.

In addition, a plating layer such as a nickel (Ni)/tin (Sn) plating layer, or the like, may be formed on a surface of the connection portion.

The plurality of positive electrode land patterns 211a and 214 may be disposed on an upper surface of the body 210 to be spaced apart from each other in the X direction, and the first external electrodes 131 corresponding to positive electrodes of the multilayer capacitors 100 may be mounted thereon.

Here, one positive electrode land pattern 211a may be exposed to a first edge of the body 210 in the X direction. In addition, the other positive electrode land pattern 214 may be disposed to be spaced apart from the first edge in the X direction.

The plurality of negative electrode land patterns 212a and 213 may be alternately disposed on the upper surface of the body 210 to be spaced apart from the positive electrode land patterns 211a and 214 in the X direction, and the second external electrodes 132 corresponding to negative electrodes of the multilayer capacitors 100 may be mounted thereon.

Here, one negative electrode land pattern 212a may be exposed to a second edge of the body 210 opposing the first edge thereof in the X direction. Further, the other negative electrode land pattern 213 may be disposed to be spaced apart from the second edge in the X direction and disposed between the positive electrode land patterns 211a and 214.

The positive and negative electrode terminal patterns 211c and 212c may be formed on a lower surface of the body 210 to be spaced apart from each other in the X direction.

The positive and negative electrode terminal patterns 211c and 212c may serve as terminals for mounting the electronic component in an external device.

Here, the positive electrode terminal pattern 211c may be exposed to a third edge of the body 210 in the X direction, and the negative electrode terminal pattern 212c may be exposed to a fourth edge of the body 210 opposing the third edge thereof in the X direction.

The positive electrode connection portion may serve to connect the plurality of positive electrode land pattern 211a and 214 to the positive electrode terminal pattern 211c.

The positive electrode connection portion as described above may include a positive electrode connection pattern 211b formed on a first surface of the body 210 in the X direction, at least one positive via electrode 232 formed in the body 210 of the board 200 in the Z direction, and at least one positive electrode conductive layer 234 for connecting the positive via electrodes 232 to each other.

Further, a plurality of grooves 221 may be formed in the first surface of the body 210 in the X direction, and the positive electrode connection pattern 211b may be formed in each of the plurality of grooves 221.

The negative electrode connection portion may serve to connect the plurality of negative pattern 212a and 213 to the negative electrode terminal pattern 212c.

The negative electrode connection portion as described above may include a negative electrode connection pattern 212b formed on a second surface of the body 210 opposing the first surface thereof in the X direction, at least one negative via electrode 231 formed in the body 210 of the board 200 in the Z direction, and at least one negative electrode conductive layer 233 for connecting the negative via electrodes 231 to each other.

Further, a plurality of grooves 222 may be formed in the second surface of the body 210 in the X direction, and the negative electrode connection pattern 212b may be formed in each of the plurality of grooves 222.

According to the structure as described above, the first external electrodes 131 of the multilayer capacitors 100 may be connected to the positive electrode terminal pattern 211c through the positive electrode land pattern 211a and the positive electrode connection pattern 211b or through the positive electrode land pattern 214, the positive via electrode 232, and the positive electrode conductive layer 234.

Further, the second external electrodes 132 of the multilayer capacitors 100 may be connected to the negative electrode terminal pattern 212c through the negative electrode land pattern 212a and the negative electrode connection pattern 212b or through the negative electrode land pattern 213, the negative via electrode 231, and the negative electrode conductive layer 233.

Capacitance of the electronic component configured as described above may be equally measured to a value calculated by multiplying capacitance of a single multilayer capacitor by a total number of multilayer capacitors, such that the electronic component has an advantage in that the same mounting pad as that of a large-sized multilayer capacitor according to the related art may be used without a capacitance loss.

Therefore, since the electronic component 1 according to the present exemplary embodiment is formed by stacking a plurality of multilayer capacitors having a size at which a manufacturing process is easy and a yield is high, there are advantages in that a product having a super size of 4532 size or more and high capacitance may be manufactured.

Modified Exemplary Embodiment

Figure 8:
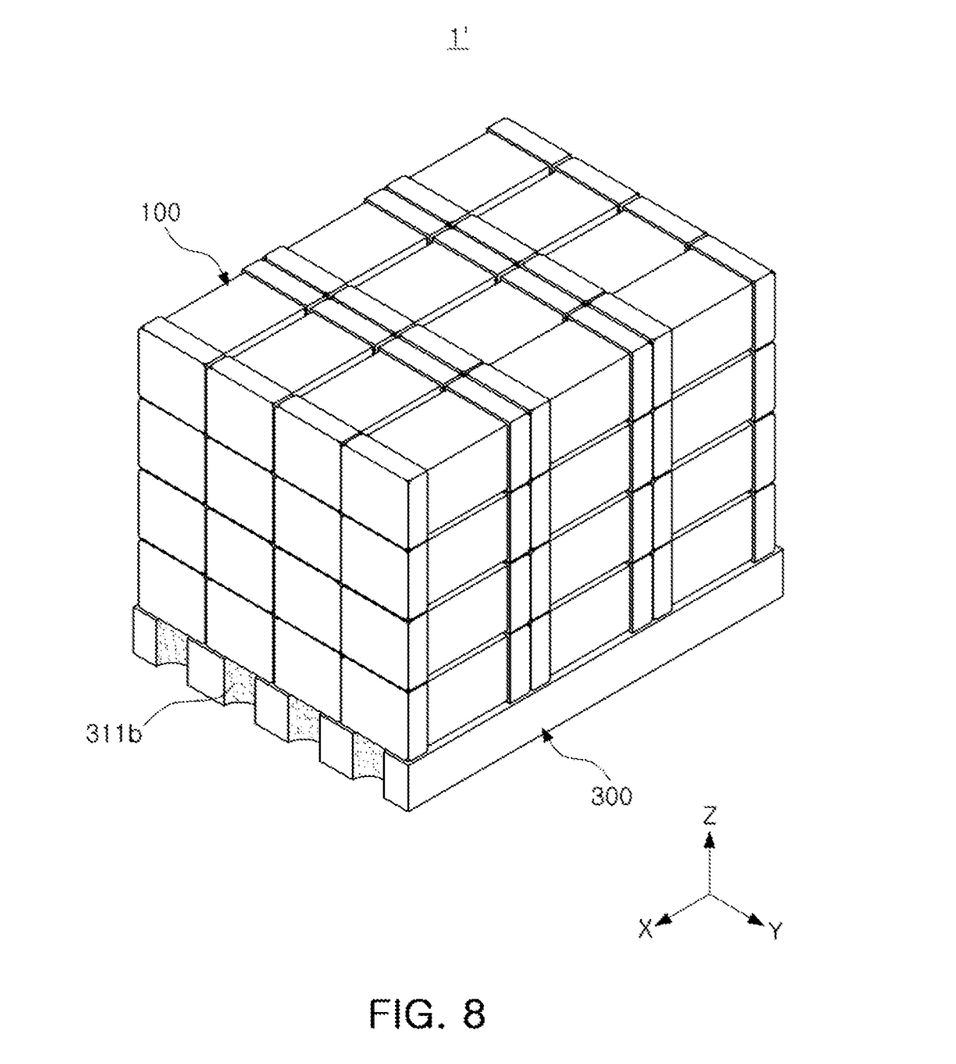
FIG. 8 is a perspective view of an electronic component according to another exemplary embodiment in the present disclosure.
Figure 9:
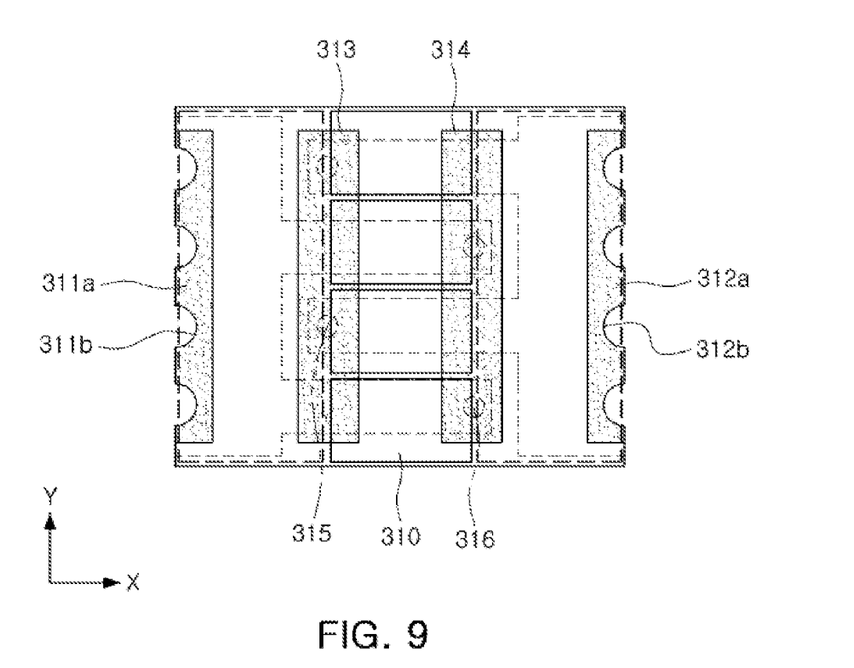
FIG. 9 is a front view of a board of the electronic component of FIG. 8.
Figure 10:
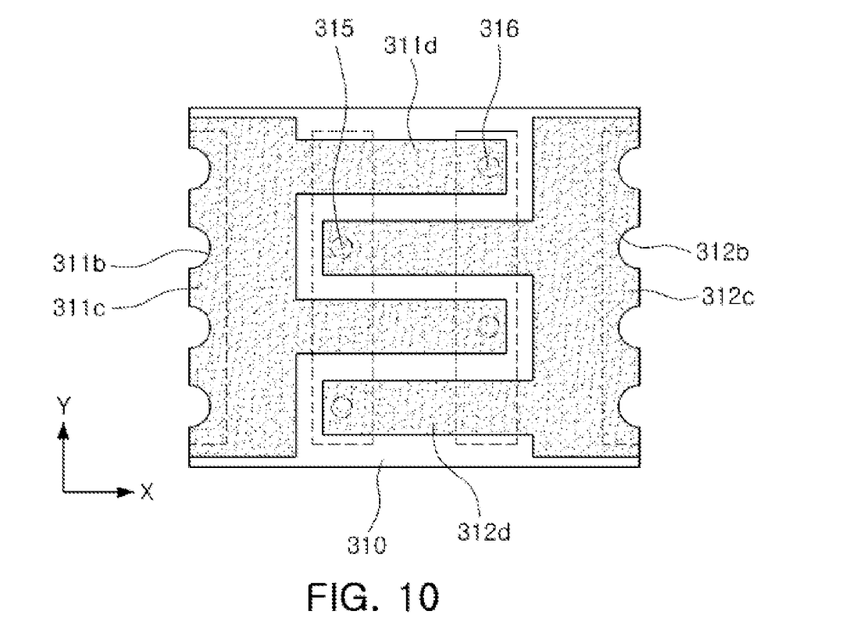
FIG. 10 is a rear view of the board of the electronic component of FIG. 8.

FIG. 8 is a perspective view of an electronic component according to another exemplary embodiment in the present disclosure, FIG. 9 is a front view of a board of the electronic component of FIG. 8, and FIG. 10 is a rear view of the board of the electronic component of FIG. 8.

Referring to FIGS. 8 through 10, the electronic component according to the present exemplary embodiment may include a first positive electrode land pattern 311a exposed to a first edge of a body 310 in an X direction and a second land pattern 314 disposed on an upper surface of the body 310 to be spaced apart from the first positive electrode land pattern 311a in the X direction.

Further, a negative electrode land pattern may include a first negative pattern 312a exposed to a second edge of the body 310 opposing the first edge thereof and a second negative electrode land pattern 313 disposed on the upper surface of the body 310 between the first and second positive electrode land patterns 311a and 314.

Further, a positive electrode terminal pattern may include a first body portion 311c exposed to a third edge of the body 310 in the X direction and at least one first extension portion 311d extended from the first body portion 311c to a portion of a lower surface of the body 310 corresponding to the second positive electrode land pattern 314 in a Z direction.

Here, a plurality of first extension portions 311d may be disposed to be spaced apart from each other in a Y direction.

Further, a negative electrode terminal pattern may include a second body portion 312c exposed to a fourth edge of the body 310 opposing the third edge thereof in the X direction and at least one second extension portion 312d extended from the second body portion 312c to a portion of the lower surface of the body 310 corresponding to the second negative electrode land pattern 313 in the Z direction.

Here, a plurality of second extension portions 312d may be disposed to be spaced apart from each other in the Y direction.

In addition, a positive electrode connection portion may include a positive electrode connection pattern 311b formed on a first surface of the body 310 in the X direction and connecting the first positive electrode land pattern 311a and the first body portion 311c to each other, and a first via electrode 316 connecting the second positive electrode land pattern 314 and the first extension portion 311d to each other.

Further, a negative electrode connection portion may include a negative electrode connection pattern 312b formed on a second surface of the body 310 opposing the first surface thereof in the X direction and connecting the first negative electrode land pattern 312a and the second body portion 312c to each other, and a second via electrode 315 connecting the second negative electrode land pattern 313 and the second extension portion 312d to each other.

Here, a first external electrode 131 of a multilayer capacitor 100 may be mounted on the first and second positive electrode land patterns 311a and 314, and a second external electrode 132 of the multilayer capacitor 100 may be mounted on the first and second negative electrode land patterns 312a and 313.

According to this structure, the first external electrodes 131 of the multilayer capacitors 100 may be connected to the first body portion 311c of the positive electrode terminal pattern through the first positive electrode land pattern 311a and the positive electrode connection pattern 311b, and connected to the first extension portion 311d of the positive electrode terminal pattern through the second positive electrode land pattern 314 and the first via electrode 316.

Further, the second external electrodes 132 of the multilayer capacitors 100 may be connected to the second body portion 312c of the negative electrode terminal pattern through the first negative electrode land pattern 312a and the negative electrode connection pattern 312b, and connected to the second extension portion 312d of the negative electrode terminal pattern through the second negative electrode land pattern 313 and the second via electrode 315.

Figure 11:
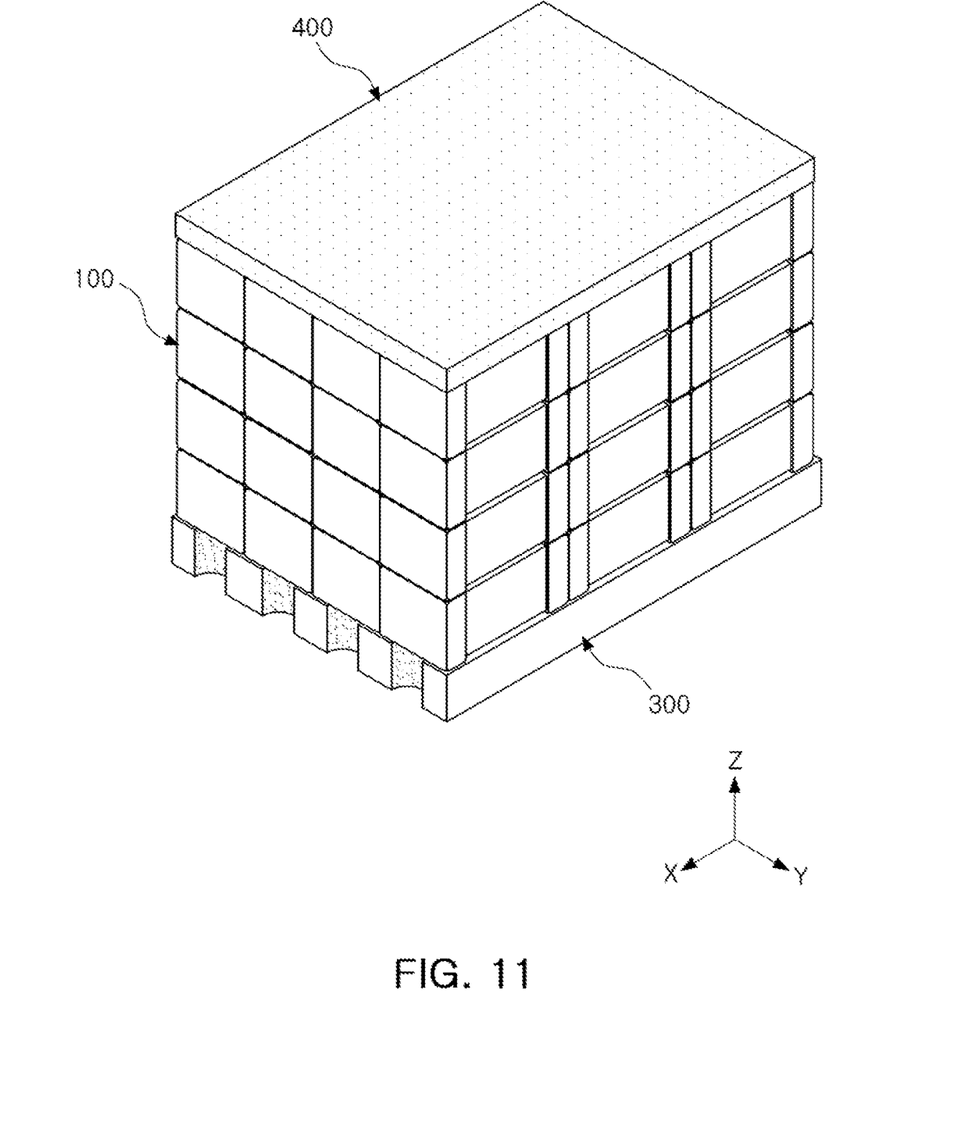
FIG. 11 is a perspective view illustrating a case in which an insulating layer is further formed on the electronic component of FIG. 8.

Meanwhile, as illustrated in FIG. 11, an insulating layer 400 may be formed to cover upper portions of a plurality of multilayer capacitors 100.

The insulating layer 400 as described above may allow the upper portions of the plurality of multilayer capacitors 100 to be flat, thereby serving to prevent a pick-up defect at the time of performing surface mounting technology (SMT) pick-up and prevent a short-circuit with other components adjacent thereto on the upper portions of the multilayer capacitors.

As set forth above, according to exemplary embodiments in the present disclosure, the plurality of multilayer capacitors may be stacked to be connected in parallel to each other, the manufacturing process may be easy, high capacitance may be implemented, reliability of the product may be secured at a predetermined level or more, and the defect ratio may be decreased at a predetermined level or less.

While exemplary embodiments have been shown and described above, it will be apparent to those skilled in the art that modifications and variations could be made without departing from the scope of the present invention as defined by the appended claims.

What is claimed is:

1. An electronic component comprising:
    a plurality of multilayer capacitors stacked in multiple rows and columns and each having external electrodes on both ends thereof in a first direction; and
    a board including a body and a connection portion,
    wherein the connection portion includes:
    a plurality of positive electrode land patterns, disposed on an upper surface of the body to be spaced apart from each other in the first direction and on which positive external electrodes of the multilayer capacitors are mounted;
    a plurality of negative electrode land patterns, disposed on the upper surface of the body to alternate with the positive electrode land patterns in the first direction and on which negative external electrodes of the multilayer capacitors are mounted;
    positive and negative electrode terminal patterns disposed on a lower surface of the body to be spaced apart from each other in the first direction;
    a positive electrode connection portion connecting the plurality of positive electrode land patterns to the positive electrode terminal pattern; and
    a negative electrode connection portion connecting the plurality of negative electrode land patterns to the negative electrode terminal pattern,
    wherein the positive electrode land pattern includes a first positive electrode land pattern exposed to a first edge of the body in the first direction and a second positive electrode land pattern disposed on the upper surface of the body to be spaced apart from the first positive electrode land pattern in the first direction,
    the negative electrode land pattern includes a first negative electrode land pattern exposed to a second edge of the body opposing the first edge thereof and a second negative electrode land pattern disposed on the upper surface of the body between the first and second positive electrode land patterns,
    the positive electrode terminal pattern includes a first body portion exposed to a third edge of the body in the first direction and at least one first extension portion extended from the first body portion to a position corresponding to the second positive electrode land pattern,
    the negative electrode terminal pattern includes a second body portion exposed to a fourth edge of the body opposing the third edge thereof, and at least one second extension portion extended from the second body portion to a position corresponding to the second negative electrode land pattern, the plurality of multilayer capacitors are arranged in at least three rows, first external electrodes of the multilayer capacitors in a bottommost-middle row are mounted on the second positive electrode land pattern, and second external electrodes of the multilayer capacitors in the bottommost-middle row are mounted on the second negative electrode land pattern.

2. The electronic component of claim 1, wherein one of the positive electrode land patterns is exposed to a first edge of the body in the first direction, one of the negative electrode land patterns is exposed to a second edge of the body opposing the first edge thereof, the positive electrode terminal pattern is exposed to a third edge of the body in the first direction, the negative electrode terminal pattern is exposed to a fourth edge of the body opposing the third edge thereof, one of the positive electrode connection portions is a positive electrode connection pattern formed on a first surface of the body in the first direction, and one of the negative electrode connection portions is a negative electrode connection pattern formed on a second surface of the body opposing the first surface thereof in the first direction.

3. The electronic component of claim 2, wherein a plurality of grooves are formed in the first and second surfaces of the body, and the positive and negative electrode connection patterns are formed in the plurality of grooves, respectively.

4. The electronic component of claim 1, wherein the positive electrode connection portion includes at least one positive via electrode formed in the board in a thickness direction, and the negative electrode connection portion includes at least one negative via electrode formed in the board in the thickness direction.

5. The electronic component of claim 4, wherein the positive electrode connection portion further includes at least one positive electrode conductive layer disposed in the board, and the negative electrode connection portion includes at least one negative electrode conductive layer disposed in the board.

6. The electronic component of claim 1, wherein adjacent external electrodes of the plurality of multilayer capacitors are connected to each other to form a single capacitor block, and a plurality of capacitor blocks are stacked on the board in multiple rows and columns.

7. The electronic component of claim 6, wherein in the capacitor block, an adhesive portion is disposed between external electrodes of adjacent multilayer capacitors.

8. The electronic component of claim 6, wherein the adjacent external electrodes are directly connected to each other.

9. The electronic component of claim 6, wherein a conductive adhesive layer is disposed between the capacitor block and the board.

10. The electronic component of claim 9, wherein the conductive adhesive layer is a flux or solder.

11. The electronic component of claim 1, wherein the positive electrode connection portion includes a positive electrode connection pattern disposed on a first surface of the body in the first direction and connecting the first positive electrode land pattern and the first body portion to each other, and a first via electrode connecting the second positive electrode land pattern and the first extension portion to each other, the negative electrode connection portion includes a negative electrode connection pattern disposed on a second surface of the body opposing the first surface thereof in the first direction and connecting the first negative electrode land pattern and the second body portion to each other, and a second via electrode connecting the second negative electrode land pattern and the second extension portion to each other, and first external electrodes of the multilayer capacitors are mounted on the first and second positive electrode land patterns, and second external electrodes of the multilayer capacitors are mounted on the first and second negative electrode land patterns.

12. The electronic component of claim 11, further comprising an insulating layer covering upper portions of the plurality of multilayer capacitors.

13. The electronic component of claim 1, wherein the multilayer capacitor includes a capacitor body including first and second internal electrodes stacked to be alternately exposed to both surfaces thereof in a length direction, and the first and second internal electrodes are connected to the first and second external electrodes, respectively.

14. The electronic component of claim 13, wherein in the multilayer capacitor, first and second plated layers are disposed on the first and second external electrodes, respectively.

15. The electronic component of claim 14, wherein the first and second plated layers are tin (Sn) plated layers.

16. The electronic component of claim 15, wherein adjacent multilayer capacitors are directly connected to each other through the tin (Sn) plated layers of the first and second external electrodes, respectively.

* * * * *